(12) United States Patent
Dultz et al.

(10) Patent No.: US 7,920,617 B1
(45) Date of Patent: Apr. 5, 2011

(54) METHOD AND DEVICE FOR COHERENT ADDITION OF SEMICONDUCTOR LASER EMISSION

(75) Inventors: Wolfgang Dultz, Frankfurt am Main (DE); Gregor Angelow, Darmstadt (DE); Franco Giulio Laeri, Darmstadt (DE)

(73) Assignee: Deutsche Telekom AG, Bonn (DE)

( * ) Notice: Subject to any disclaimer, the term of this patent is extended or adjusted under 35 U.S.C. 154(b) by 0 days.

(21) Appl. No.: 09/429,570

(22) Filed: Oct. 28, 1999

(30) Foreign Application Priority Data

Oct. 29, 1998 (DE) .................................. 198 49 869

(51) Int. Cl.
*H01S 3/08* (2006.01)
(52) U.S. Cl. .................. 372/101; 372/43.01; 372/50.12; 372/107
(58) Field of Classification Search .................... 372/18, 372/92, 98, 99, 101, 75, 43.01, 50.12; 359/333, 359/340, 341.3, 346
See application file for complete search history.

(56) References Cited

U.S. PATENT DOCUMENTS

| | | | |
|---|---|---|---|
| 4,246,548 A | 1/1981 | Rutz | |
| 4,656,641 A | 4/1987 | Scifres et al. | |
| 4,933,649 A | 6/1990 | Swanson et al. | |
| 4,972,427 A | 11/1990 | Streifer et al. | |
| 5,052,007 A * | 9/1991 | Auzel | 372/45 |
| 5,446,754 A | 8/1995 | Jewell et al. | |
| 5,661,747 A | 8/1997 | Hiiro | |

FOREIGN PATENT DOCUMENTS

DE 43 31 979 C2 3/1995

OTHER PUBLICATIONS

G. Angelow et al., "Designing resonators with large mode volume and high mode discrimination", Optics Letters, vol. 21, No. 17, Sep. 1, 1996, pp. 1324-1326.
S. Kirkpatrick et al., "Optimization by Simulated Annealing", Science, vol. 220, No. 4598, May 13, 1983, pp. 671-679.
H. Hänsel et al., "Single-Mode Diode Laser Radiation From a Multiple-Stripe diode laser using a diffracto-optical external cavity", Laser and Optoelektronik, vol. 26, No. 1, 1994, pp. 49-55, Abstract & Extended Abstract Only.
J. Leger et al., "External diode-laser-array cavity with mode-selecting mirror", Appl. Phys. Lett., vol. 63, No. 21, Nov. 22, 1993, pp. 2884-2886.

* cited by examiner

*Primary Examiner* — Dung T Nguyen
(74) *Attorney, Agent, or Firm* — Kenyon & Kenyon LLP

(57) ABSTRACT

A method and device for coherent addition of semiconductor laser emission, in particular for use in telecommunications. Individual emitters are coupled, each emitter to some extent experiencing some of the emission of all the others. Rather than all emitting independently of one another, the emitters are arranged in a common resonator. Using an optimization method, e.g., the simulated annealing method, the shape of the resonator mirror may be optimized until it optimally fulfils a preassigned set of mathematical requirements which constitute a set criterion. The individual emitters in the form of individual diodes, a diode matrix or a diode bar are arranged between two or more mirrors. At least one of these mirrors has a special, non-spherical surface that forms an internal correction element. Alternatively, the mirrors may be spherical-shaped with at least one non-spherical phase plate arranged in the resonator beam path. Outside the resonator a further system that includes a generator and a secondary beam shaper transforms the emitted beam so that it has the desired amplitude distribution and phase distribution and the desired irradiance.

10 Claims, 3 Drawing Sheets

METHOD AND DEVICE FOR COHERENT ADDITION OF SEMICONDUCTOR LASER EMISSION

FIELD OF THE INVENTION

The invention relates to a method for coherent addition of semiconductor laser emission.

RELATED TECHNOLOGY

The optical power emitted by a semiconductor is basically limited by the irradiance on the semiconductor decouple surfaces. If the material destruction threshold (destruction threshold) is exceeded, irreversible damage is caused in the crystal end surfaces and laser emission breaks down. According to existing knowledge, the only way to increase the power of semiconductor lasers is to increase the cross-sectional area. However, as the thickness of the light-emitting layer in bar-diode lasers has to meet certain technical specifications, the cross section is usually increased by increasing the width of the bar (wide-bar diodes).

However, if one increases the emission surface, this has an important, undesirable consequence, namely that the quality of the beam deteriorates. One way to define the quality of the beam is in terms of focusability of beam power, i.e., the maximum irradiance that can be achieved at the focal spot. The highest irradiance levels can be achieved with a single-mode beam (diffraction limit). However, if one widens the emission bar of laser diodes, the light emitted becomes multi-mode. Although the power emitted by the diode increases, this power cannot be focused at a small focal spot. The size of the focal spot increases quasi-proportionally to the root of the number of modes. At best, the irradiance remains constant. Thus scaling of the laser cross section results in higher output power, but this power is distributed among a plurality of modes. Unfortunately, these modes cannot all be focused coherently in the same spot. This is a major disadvantage in many applications, for example if the laser beam is to be coupled to a single-mode fiber or if material processing is to be carried out at the focus spot. Furthermore, a multi-mode field cannot be effectively collimated, i.e., it diverges fairly significantly, which is a disadvantage if the light is to be transported across relatively large distances via free propagation (communications or similar applications). In the article entitled "Designing resonators with large mode volume and time mode discrimination" (*Optics Letters*, Vol. 21, No. 17, Sep. 1, 1996), which is hereby incorporated by reference herein, G. Angelow, F. Laeri and T. Tschudi discuss a number of options for the method for manufacturing a diffuser for use in an optical resonator described in German Patent Document No. 43 31 979 C2, which is also hereby incorporated by reference herein, and the device for generating preassignable light distribution using this diffuser with laser diodes, given that the technology and markets for this method and device are developing rapidly, especially in telecommunications.

SUMMARY OF THE INVENTION

An object of the present invention is to create a method and a device for coherent addition of semiconductor laser emission with which one can achieve large mode volume so that one can use as many individual emitters as possible therein, it being important that one can achieve freely selectable mode geometry, so that, for example, the resonator can be modified to suit the emission geometry of one or more wide bars, thus ensuring that effective mode selection is feasible, i.e., all resonator eigenmodes should have large losses aside from the desired one, which should then be emitted exclusively, distribution of optical power being in accordance with Gaussian distribution.

The present invention provides a method for coherent addition of semiconductor laser emission, in particular for use in telecommunications and if the light is to be transported across relatively large distances via free propagation, wherein individual emitters in the form of individual diodes, a diode matrix or diode bars are arranged between two or more mirrors, at least one of these mirrors has a non-spherical surface, and outside an external resonator a further system of modified phase plates in the form of external generalized lenses transforms the emitted beam so that it has the desired amplitude distribution and phase distribution and the desired irradiance.

The present invention also provides a device for coherent addition of semiconductor laser emission wherein individual emitters in the form of individual diodes, a diode matrix, or diode bars are arranged between two or more mirrors, at least one of the mirrors has a special, non-spherical surface and is used as an internal correction element, a secondary beam shaper is arranged outside the resonator, and the emitted beam is transformed so that it has the desired amplitude distribution and phase distribution and the desired irradiance.

The method according to the present invention and the device according to the present invention have major advantages, especially in telecommunications applications. They allow one to couple high-powered laser beams to glass fibers more efficiently, which can be particularly useful, for example in pumping glass-fiber amplifiers or in non-linear transfer (solitons). These advantages are particularly apparent in pumping glass-fiber amplifiers, in which pumped emission is coupled to a glass-fiber amplifier, because in this application an O-shaped beam is often preferable. In this case the laser resonator can be designed so that the O-shaped beam is emitted directly from the laser resonator.

With the present invention, one can achieve a large mode volume and thus for the first time actually use a plurality of individual emitters. In addition, mode geometry is now freely selectable so that the resonator can be modified to suit the emission geometry of one or more wide bars.

In addition, the method and device according to the present invention allow effective mode selection, i.e., all resonator eigenmodes have large losses aside from the desired one, which is then emitted exclusively. In addition, with the method according to the present invention, distribution of optical power is in accordance with Gaussian distribution. A notable feature of the method according to the present invention is that it is propagation-invariant, i.e., both the far field and the near field are Gaussian.

By approaching the design problem as a mathematical optimization problem that can be tackled using global optimization tools, e.g., the simulated annealing method described by S. Kirkpatrick, C. D. Gelatt Jr., and M. P. Vecchi, in *Science*, Vol. 220, No. 4598, 13 May 1983, pages 671-680, which is hereby incorporated by reference herein, one can optimize the shape of the resonator mirror until it optimally fulfills a preassigned set of mathematical requirements which constitute a set criterion, additional limiting conditions such as special features of the mirror manufacturing method also being applicable in addition to the established requirements. With this method, one can always prepare an eigenmode with low losses, while the rest of the mode spectrum has high losses. Thus one can achieve single-mode emission. However, the mirrors of the assigned resonator are not spherical, and the mode spectrum is no longer within the Hermite-Gauss mode class. However, the mode that is emitted has stationary phase distribution as a singular element of the eigenvalue spectrum. This is particularly advantageous, as a beam of this kind can always been transformed so that it has any distribution desired, in particular Gaussian distribution, using a generalized lens system (for example a Schmitt correction plate).

BRIEF DESCRIPTION OF THE DRAWING

Further advantages, features and applications of the present invention, in particular the arrangement of individual emitters between mirrors, are described in the description below in conjunction with the drawing, in which.

DETAILED DESCRIPTION

Figure 1:
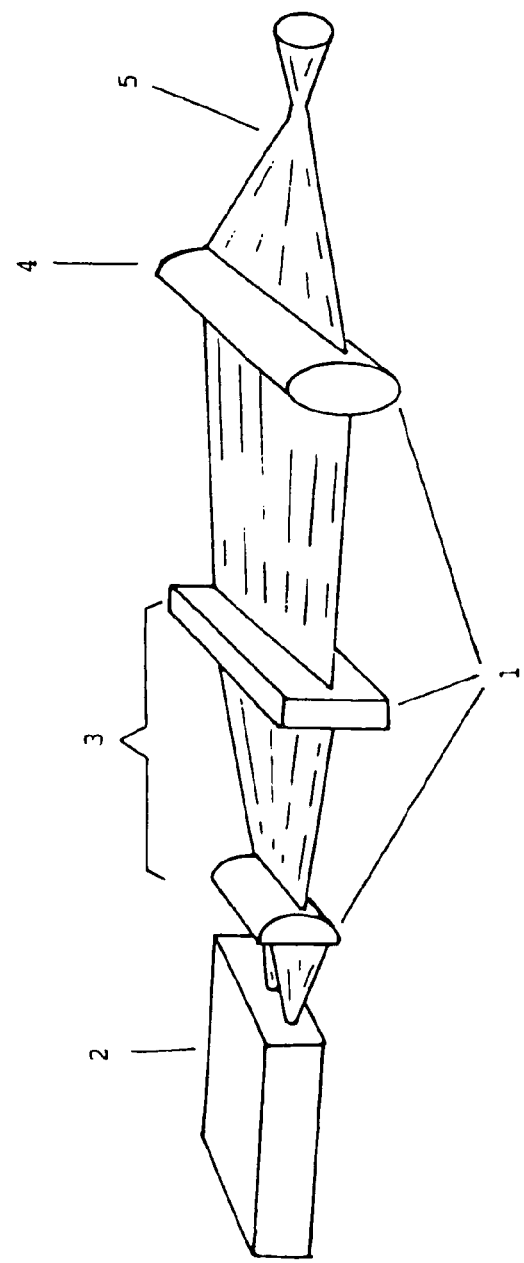
FIG. 1 shows an illustration of combined refractive/diffractive optical elements, calculated as an inverse boundary value problem.

The terms and associated reference characters in the attached list of reference characters are used in the description, the patent claims, the abstract and in the drawing.

FIG. 1 shows combined refractive/diffractive optical elements calculated as an inverse boundary value problem. The arrangement according to FIG. 1 includes three mirrors 1 and a resonator 3, which is arranged downstream from diode bar 2 having in this case 50 Watts of power and is formed by the two left mirrors in FIG. 1. Secondary beam shaper 4 is linked to resonator 3 and produces irradiance 5 in the amount of 5 Megawatts per cm$^2$ (35 W/30 μm ϕ).

In this exemplary embodiment, the individual emitters are shown as diode bar 2; however, they can also be in the form of individual diodes or a diode matrix. The arrangement according to FIG. 1 is merely an exemplary arrangement, so, for example, the individual emitters may also be arranged between two or more mirrors 1. It is important that at least one of these mirrors 1 has a special, non-spherical surface (internal correction element). Alternatively, mirrors 1 may be spherical-shaped, but in this case at least one non-spherical phase plate must be arranged in the resonator beam path as an internal correction element. Outside the resonator, a further system of modified phase plates (external generalized lenses) transforms the emitted beam so that it has the desired amplitude distribution and phase distribution.

Figure 2:
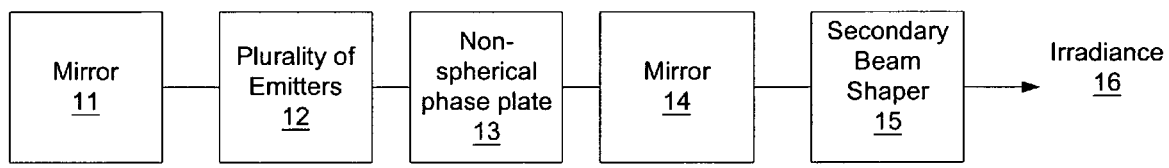
FIG. 2 shows a block diagram of an exemplary embodiment according to the present invention.

In another exemplary embodiment, FIG. 2 shows in a block diagram, an arrangement showing mirror 11 disposed on a left side of the plurality of emitters 12 and a non-spherical phase plate (or mirror) 13 disposed to the right of the plurality of emitters 12. Next to the non-spherical phase plate is shown another mirror 14, and then a secondary beam shaper 15 effecting irradiance 16. The secondary beam shaper 15 block may represent a one-dimensional and/or a two-dimensional beam shaper.

Figure 3:
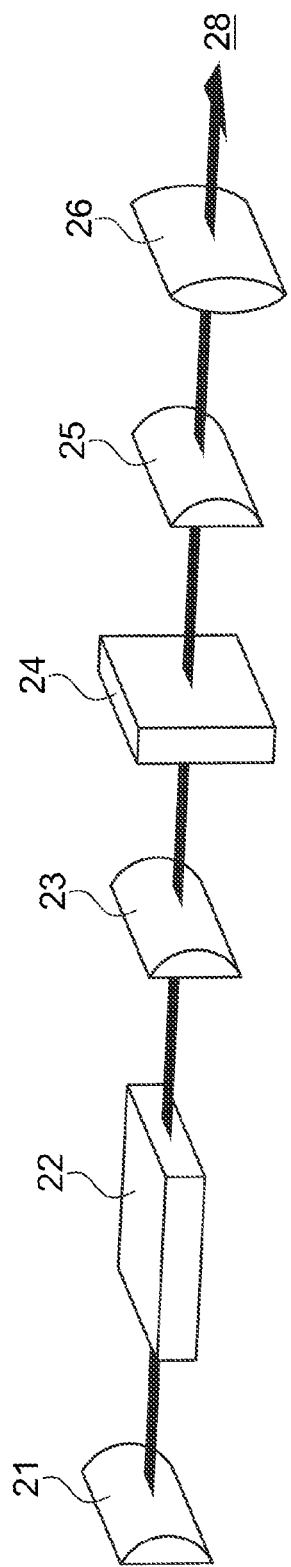
FIG. 3 shows an exemplary embodiment according to the present invention.

In another exemplary embodiment, FIG. 3 shows an exemplary arrangement showing a plurality of emitters 22 disposed between two spherical mirrors 21, 23. A non-spherical phase plate 24 is disposed downstream from the spherical mirror 23. Another mirror 25 is shown downstream from the non-spherical phase plate 24. A secondary beam shaper 26 is shown downstream from the mirror 25. The resulting emission 28 from beam shaper 26 can have a one-dimensional structure or a two-dimensional structure. If laser diodes are used for the plurality of emitters 22, then the at least one of the two mirrors having the non-spherical surface as well as the secondary beam shaper may have a one-dimensional structure (e.g., parallel line pattern or a surface of a cylinder—see, e.g., secondary beam shaper 26). If vertical-emitting diodes (VCSEL) are used for the plurality of emitters 22, then the at least one of the two mirrors having the non-spherical surface as well as the secondary beam shaper may have a two-dimensional structure, e.g., nonspherical phase plate 24 may be a laser diode crystal whereby phase-shifting relief may be provided on the surfaces thereof.

The internal correction elements are designed using a global optimization method, or the internal correction elements and the external generalized lenses are designed together using a global optimization method such as the one described in the above-noted article by S. Kirkpatrick, et al., in *Science*, Vol. 220. The shape of resonator mirror 1 is optimized until it optimally fulfils a preassigned set of mathematical requirements which constitute a set criterion. The requirements mentioned in the Summary of the Invention section above may be included in the set of requirements; additional limiting conditions such as special features of the mirror manufacturing method may also be included. It will generally be very difficult to wholly fulfill the listed criteria. However, one can achieve a variety of solutions by assigning different weightings to the individual criteria. Using this method, one can almost always prepare an eigenmode with low losses, while the rest of the mode spectrum has high losses. Thus one can achieve single-mode emission. However, mirrors 1 of assigned resonator 3 are no longer spherical, and the mode spectrum is no longer within the Hermite-Gauss mode class. However, the mode that is emitted has stationary phase distribution as a singular element of the eigenvalue spectrum. As already mentioned, this is particularly advantageous, as a beam of this kind can always be transformed so that it has any distribution desired, in particular Gaussian distribution.

Thus, according to the method and the device of the present invention, individual emitters in the form of individual diodes, a diode matrix, a diode bar or similar are arranged between two or more mirrors 1. At least one of these mirrors 1 has a special, non-spherical surface (internal correction element). Alternatively, mirrors 1 may be spherical-shaped, but in this case at least one non-spherical phase plate (internal correction element) must be arranged in the resonator beam path. Outside resonator 3, a further system, for example in the form of a secondary beam shaper 4, of modified phase plates (external generalized lenses) transforms the emitted beam so that it has the desired amplitude distribution and phase distribution and desired irradiance 5.

The internal correction elements are designed using a global optimization method, or the internal correction elements and the external generalized lenses are designed together using a global optimization method.

When using bar diodes, the following points must be borne in mind: The bar diodes are already single-mode in one direction in space. Therefore the internal and external correction elements only need to have a one-dimensional structure (parallel-line pattern or surface of a cylinder). Therefore, the lithographic process for manufacturing the correction elements is particularly appealing. Thus the internal correction elements can be applied directly to the diode surfaces or created via an etching process (corrugated end surfaces).

With vertical-emitting diodes (VCSEL), emission becomes transverse-multimode as soon as the emitting aperture exceeds a few μm. One can achieve higher emission powers using VCSEL matrices. As a general rule, the correction elements then have a two-dimensional structure. In an alternative design, the resonator-internal correction element is the laser diode crystal, phase-shifting relief being provided on the surfaces thereof.

LIST OF REFERENCE CHARACTERS

| 1 | Mirror |
| 2 | Diode bar |
| 3 | Resonator |
| 4 | Secondary beam shaper or system |
| 5 | Irradiance |

What is claimed is:

1. A method for coherent addition of semiconductor laser emission, the method comprising:
   providing an external resonator and a plurality of individual emitters having a form of at least one of a plurality of individual diodes, a diode matrix and a plurality of diode bars, the plurality of individual emitters being disposed between at least two mirrors, at least one of the at least two mirrors including a non-spherical surface; and
   transforming an emitted beam outside the external resonator using a system of modified phase plates having a form of external generalized lenses so as to provide a transformed emitted beam having a desired amplitude distribution and phase distribution and a desired irradiance.

2. The method as recited in claim 1 wherein coherent addition of semiconductor laser emission is applied in at least one of telecommunications and an application in which light is transported across a relatively large distance via free propagation.

3. The method as recited in claim 1 further comprising coupling pumped emission of the semiconductor laser to a glass-fiber amplifier so as to generate an O-shaped beam.

4. The method as recited in claim 3 wherein the O-shaped beam is emitted directly from the external resonator.

5. A device for coherent addition of semiconductor laser emission, the device comprising:
   at least two spherical-shaped mirrors;
   a resonator;
   a plurality of individual emitters including at least one of a plurality of individual diodes, a diode matrix and a plurality of diode bars, the plurality of individual emitters being arranged between the at least two spherical-shaped mirrors;
   at least one non-spherical phase plate disposed in a beam path of the resonator for internal correction; and
   a secondary beam shaper disposed outside the resonator so as to transform an emitted beam so as to provide a transformed emitted beam having a desired amplitude distribution and phase distribution and a desired irradiance.

6. The device as recited in claim 5 wherein the at least one non-spherical phase plate is designed using a global optimization method.

7. The device as recited in claim 5 wherein the at least one non-spherical phase plate and the at least two spherical-shaped mirrors are designed together using a global optimization method.

8. The device as recited in claim 5 wherein the plurality of individual emitters includes the plurality of diode bars arranged as laser diodes, and the at least one non-spherical phase plate and the secondary beam shaper each has a one-dimensional structure.

9. The device as recited in claim 5 wherein the plurality of individual emitters includes a plurality of vertical-emitting diodes in the form of individual diodes or vertical-emitting diode matrices having emissions becoming transverse-multi-mode when an emitting aperture exceeds a few μm, and wherein the at least one non-spherical phase plate and the secondary beam shaper each has a two-dimensional structure.

10. A device for coherent addition of semiconductor laser emission, the device comprising:
    at least two mirrors;
    a resonator;
    a plurality of individual emitters including at least one of a plurality of individual diodes, a diode matrix and a plurality of diode bars, the plurality of individual emitters being arranged between the at least two mirrors;
    a laser diode-crystal disposed internal to the resonator as a correcting element, the laser-diode crystal including reliefed surfaces so as to provide phase-shifting; and
    a secondary beam shaper disposed outside the resonator so as to transform an emitted beam so as to provide a transformed emitted beam having a desired amplitude distribution and phase distribution and a desired irradiance.

* * * * *